(12) United States Patent
Zhu et al.

(10) Patent No.: US 12,387,920 B2
(45) Date of Patent: Aug. 12, 2025

(54) COLLECTION ASSEMBLY AND SEMICONDUCTOR PRE-CLEANING CHAMBER

(71) Applicant: BEIJING NAURA MICROELECTRONICS EQUIPMENT CO., LTD., Beijing (CN)

(72) Inventors: Lei Zhu, Beijing (CN); Hao Guo, Beijing (CN); Kui Xu, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 0 days.

(21) Appl. No.: 18/245,543

(22) PCT Filed: Sep. 16, 2021

(86) PCT No.: PCT/CN2021/118658
§ 371 (c)(1),
(2) Date: Mar. 16, 2023

(87) PCT Pub. No.: WO2022/057847
PCT Pub. Date: Mar. 24, 2022

(65) Prior Publication Data
US 2023/0369030 A1    Nov. 16, 2023

(30) Foreign Application Priority Data
Sep. 17, 2020  (CN) .......................... 202010980699.8

(51) Int. Cl.
*H01J 37/32*    (2006.01)

(52) U.S. Cl.
CPC .. *H01J 37/32871* (2013.01); *H01J 37/32633* (2013.01); *H01J 37/32834* (2013.01)

(58) Field of Classification Search
CPC ........... H01J 37/32633; H01J 37/32834; H01J 37/32844; H01J 37/32853; H01J 37/32871
See application file for complete search history.

(56) References Cited

U.S. PATENT DOCUMENTS

| 5,772,770 A | * | 6/1998 | Suda | .................... C23C 16/4401 |
| | | | | 118/725 |
| 6,129,808 A | * | 10/2000 | Wicker | ................. H01J 37/321 |
| | | | | 156/914 |

(Continued)

FOREIGN PATENT DOCUMENTS

| CN | 101504910 A | 8/2009 |
| CN | 105097401 A | 11/2015 |

(Continued)

OTHER PUBLICATIONS

The World Intellectual Property Organization (WIPO) International Search Report for PCT/CN2021/118658 Dec. 17, 2021 5 Pages (including translation).

(Continued)

*Primary Examiner* — Benjamin Kendall
(74) *Attorney, Agent, or Firm* — ANOVA LAW GROUP, PLLC

(57) ABSTRACT

The invention provides a collection assembly and a semiconductor pre-cleaning chamber, which relate to the semiconductor processing apparatus field. The collection assembly is configured to collect particle impurities in the semiconductor pre-cleaning chamber, and includes a protection plate and a collection plate arranged at an interval in the semiconductor pre-cleaning chamber. The protection plate is annular. A plurality of first through-holes are arranged at the protection plate and configured for the process gas in the semiconductor pre-cleaning chamber to pass through. The collection plate is located on a side of an (Continued)

air outlet end of the first through-holes and configured to capture at least a part of the particle impurities in the semiconductor pre-cleaning chamber passing through the first through-holes.

11 Claims, 7 Drawing Sheets

(56) References Cited

U.S. PATENT DOCUMENTS

| | | | | |
|---|---|---|---|---|
| 7,789,963 | B2* | 9/2010 | Mitrovic | H01L 21/67069 |
| | | | | 118/729 |
| 9,909,213 | B2* | 3/2018 | Shoji | C23C 16/45591 |
| 2003/0019579 | A1* | 1/2003 | Ahn | H01J 37/32834 |
| | | | | 156/345.29 |
| 2003/0029568 | A1* | 2/2003 | Brown | H01L 21/67069 |
| | | | | 156/345.52 |
| 2005/0098265 | A1* | 5/2005 | Fink | H01J 37/32633 |
| | | | | 156/345.51 |
| 2005/0224179 | A1* | 10/2005 | Moon | H01J 37/32834 |
| | | | | 156/345.29 |
| 2006/0118045 | A1* | 6/2006 | Fink | H01J 37/32623 |
| | | | | 118/723 R |
| 2007/0266945 | A1* | 11/2007 | Shuto | C23C 16/5096 |
| | | | | 118/723 E |
| 2008/0110860 | A1* | 5/2008 | Miller | H01J 37/32623 |
| | | | | 216/67 |
| 2009/0188625 | A1* | 7/2009 | Carducci | H01J 37/32467 |
| | | | | 156/345.1 |
| 2011/0042009 | A1* | 2/2011 | Lee | H01J 37/32623 |
| | | | | 156/345.43 |
| 2012/0067845 | A1 | 3/2012 | Monden et al. | |
| 2015/0064920 | A1* | 3/2015 | Dhindsa | H01J 37/32816 |
| | | | | 156/345.28 |
| 2017/0154758 | A1 | 6/2017 | Zhang et al. | |
| 2020/0066495 | A1* | 2/2020 | Noorbakhsh | H01J 37/32541 |
| 2021/0343508 | A1* | 11/2021 | Nguyen | H01J 37/32477 |

FOREIGN PATENT DOCUMENTS

| | | |
|---|---|---|
| CN | 109273342 A | 1/2019 |
| CN | 111383884 A | 7/2020 |
| CN | 112233962 A | 1/2021 |
| EP | 0814495 A2 | 12/1997 |
| EP | 1817564 A1 | 8/2007 |
| EP | 4216257 A1 | 7/2023 |
| KR | 101057931 B1 | 8/2011 |
| KR | 20150078635 A | 7/2015 |
| KR | 20160144497 A | 12/2016 |
| TW | 201001526 A | 1/2010 |
| TW | 201926510 A | 7/2019 |

OTHER PUBLICATIONS

The European Patent Office (EPO) The Extended European Search Report for 21868669.9 Apr. 25, 2024 9 Pages.

* cited by examiner

COLLECTION ASSEMBLY AND SEMICONDUCTOR PRE-CLEANING CHAMBER

CROSS-REFERENCE TO RELATED APPLICATIONS

This application is a national phase entry under 35 U.S.C. § 371 of International Application No. PCT/CN2021/118658, filed on Sep. 16, 2021, which claims priority to Chinese Application No. 202010980699.8 filed on Sep. 17, 2020, the entire contents of both of which are incorporated herein by reference.

TECHNICAL FIELD

The present disclosure generally relates to the semiconductor processing apparatus technology field and, more particularly, to a collection assembly and a semiconductor pre-cleaning chamber.

BACKGROUND

Plasma apparatuses are widely used in a manufacturing process of semiconductor chip manufacturing, packaging, light emitting diode (LED), and flat panel displays. A discharge type of a plasma apparatus used in existing technology includes DC discharge, capacitive coupling discharge, inductive coupling discharge, and electron cyclotron resonance discharge, etc., which are widely used in physical vapor deposition (PVD), plasma etching, and chemical vapor deposition (CVD), etc.

In the existing technology, after processes, such as integrated circuit (IC) manufacturing, through silicon via (TSV), and packaging, are performed on the wafer, pre-cleaning needs to be performed on the wafer. Then, metal films such as aluminum and copper are deposited by magnetron sputtering to form metal contacts or metal interconnections. The pre-cleaning process is performed in a semiconductor pre-cleaning chamber (e.g., a pre-cleaning chamber). Gases such as Ar (argon), He (helium), and H2 (hydrogen) are excited into the plasma to generate a large amount of active groups, such as electrons, ions, excited atoms, molecules, and free radicals. These active groups have various chemical reactions and physical bombardment with the surface of the wafer to remove impurities on the surface of the wafer to facilitate the subsequent PVD process to be effectively performed and significantly improve the adhesion of the deposited film. Otherwise, the impurities on the surface of the wafer will significantly increase the resistance of the circuit to increase the heat loss of the circuit to further reduce the performance of the chip.

However, the semiconductor pre-cleaning chamber in the existing technology has a poor collection effect on particle impurities. The residual particle impurities are likely to cause contamination of an inner wall surface of the semiconductor pre-cleaning chamber. The contaminated semiconductor pre-cleaning chamber will cause a high risk of contaminating the pre-cleaned wafer a second time.

SUMMARY

The present disclosure is intend to solve one of the technical problems in the existing technology and provides a collection assembly and a semiconductor pre-cleaning chamber to solve. Thus, the technical problem of a collection effect of particle impurities is poor, and the remaining particle impurities are easy to cause contamination on the inner wall of the semiconductor precleaning chamber to bring a high risk of contaminating the wafer again in the semiconductor pre-cleaning chamber in the existing technology.

A first purpose of the present disclosure is to provide a collection assembly configured to collect particle impurities in a semiconductor pre-cleaning chamber and including a protection plate and a collection plate arranged at an interval in the semiconductor pre-cleaning chamber, wherein the protection plate is annular, and a plurality of first through-holes for a process gas of the semiconductor pre-cleaning chamber to pass are arranged at the protection plate; and the collection plate is located on a side of a gas outlet end of the first through-holes and configured to capture at least a part of the particle impurities in at least part of the semiconductor pre-cleaning chamber passing through the first through-holes.

In some embodiments, the collection plate is annular and arranged opposite to the protection plate, and orthogonal projections of all the first through-holes of the protection plate on a horizontal plane are within an orthogonal projection of the collection plate on the horizontal plane.

In some embodiments, a surface of the collection plate opposite to the protection plate is a plane, and the plane is parallel to the protection plate or is inclined relative to the protection plate.

In some embodiments, a surface of the collection plate opposite to the protection plate has a concave structure.

In some embodiments, the concave structure includes an annular concave groove arranged around a circumference of the collection plate.

In some embodiments, a shape of a longitudinal cross-section of the annular groove includes a rectangle, an arc, or a triangle.

In some embodiments, an outer peripheral edge of the collection plate includes an annular protrusion extending toward a direction close to the protection plate, and a gap is provided between an end of the annular protrusion close to the protection plate and the protection plate.

In some embodiments, the surface of the collection plate opposite to the protection plate is a roughened surface.

In some embodiments, the collection assembly further includes a distance adjustment structure configured to adjust a distance between the collection plate and the protection plate.

In some embodiments, the distance adjustment structure includes at least one distance adjustment piece, the at least one distance adjustment piece is arranged between the collection plate and the protection plate and is located at an inner or outer peripheral edge of the protection plate, and the distance between the collection plate and the protection plate is adjusted by setting a number and/or thickness of the distance adjustment piece.

In some embodiments, the collection plate is also provided with a connection member, the connection member being arranged at an inner or outer peripheral edge of the collection plate, and a plurality of threaded holes being correspondingly arranged at the connection member and the protection plate and distributed at intervals along a circumference of the protection plate;

and the collection assembly further includes a plurality of fastening screws, the fastening screws being threadedly connected to the threaded holes in a one-to-one correspondence and configured to fixedly connect the connection member to the protection plate.

In some embodiments, at least two collection plates are arranged at intervals along a direction away from the protection plate, except a collection plate of the at least two collection plates farthest to the protection plate, a plurality of second through-holes are arranged at the other collection plates, axes of the plurality of second through-holes of two neighboring collection plates do not coincide, and axes of second through-holes of the collection plate closest to the protection plate do not coincide axes of the first through-holes of the protection plate.

A second purpose of the present disclosure is to provide a semiconductor pre-cleaning chamber, including a chamber, a Faraday cup arranged in the chamber, a base configured to carry a wafer, and the collection assembly of the present disclosure, wherein the protection plate of the collection assembly is sleeved on the base, and when the base is in a process position, the protection plate cooperates with the Faraday cup to divide space inside the chamber body into an upper sub-chamber and a lower sub-chamber.

The present disclosure has the following beneficial effects.

The collection assembly of the present disclosure includes a protection plate and a collection plate arranged at an interval in the semiconductor pre-cleaning chamber, wherein the protection plate is annular to be able to sleeve around the base in the semiconductor pre-cleaning chamber. The protection plate is provided with a plurality of first through-holes for the process gas in the semiconductor pre-cleaning chamber to pass through. Meanwhile, hole walls of the first through-holes can collect a small amount of particle impurities carried by the airflow. The collection plate is located on a side of the air outlet end of the first through-holes and configured to capture at least a part of the particle impurities passing through the first through-holes in the semiconductor pre-cleaning chamber. Since the collection plate is opposite to the air outlet direction of the first through-holes, the airflow carrying a large amount of the particle impurities will collide with the surface of the collection plate to effectively collect the particle impurities on the surface of the collection plate. Thus, the remaining particle impurities in the pre-cleaning chamber can be greatly reduced and even does not exist, which is not easy to cause the contamination on the inner wall of the semiconductor pre-cleaning chamber and reduce the risk of contaminating the wafer again. In addition, the collection assembly of the present disclosure can be dissembled and cleaned when the collection assembly needs to be cleaned and has strong maintainability.

The semiconductor pre-cleaning chamber of the present disclosure has all the advantages of the above collection assembly, which are not repeated here.

BRIEF DESCRIPTION OF THE DRAWINGS

To more clearly illustrate the technical solutions of embodiments of the present disclosure or the existing technology, the accompanying drawings used in the embodiments or the existing technology are briefly introduced below. Obviously, the accompanying drawings in the following description are merely embodiments of the present disclosure. For those skilled in the art, without creative effort, other drawings can be obtained according to the accompanying drawings.

REFERENCE NUMERALS

| | | |
|---|---|---|
| 100 Protection plate | 110 First through-hole | 120 Center through-hole |
| 210 Collection plate | 211 Annular concave groove | 212 Annular protrusion |
| 213 Threaded hole | 214 Fastening screw | 215 Second through-hole |
| 220 Connection member | | |
| 300 Distance adjustment piece | | |
| 510 Chamber body | 521 First metal ring | 522 Second metal ring |
| 530 Coil | 540 Coil shielding box | 550 Coupling window |
| 560 Faraday cup | 570 Cover plate | 580 Quartz ring |
| 590 Base | | |

| | |
|---|---|
| 610 Upper electrode radio frequency power supply | 620 Upper electrode matching device |
| 630 Lower electrode radio frequency power supply | 640 Lower electrode matching device |
| 700 Vacuum pump | |
| 800 Wafer | |

DETAILED DESCRIPTION OF THE EMBODIMENTS

To make the above objects, features, and advantages of the present disclosure more comprehensible, specific embodiments of the present disclosure are described in detail below in connection with the accompanying drawings. It should be understood that the specific embodiments described here are only used to explain the present disclosure, not to limit the present disclosure.

Figure 1:
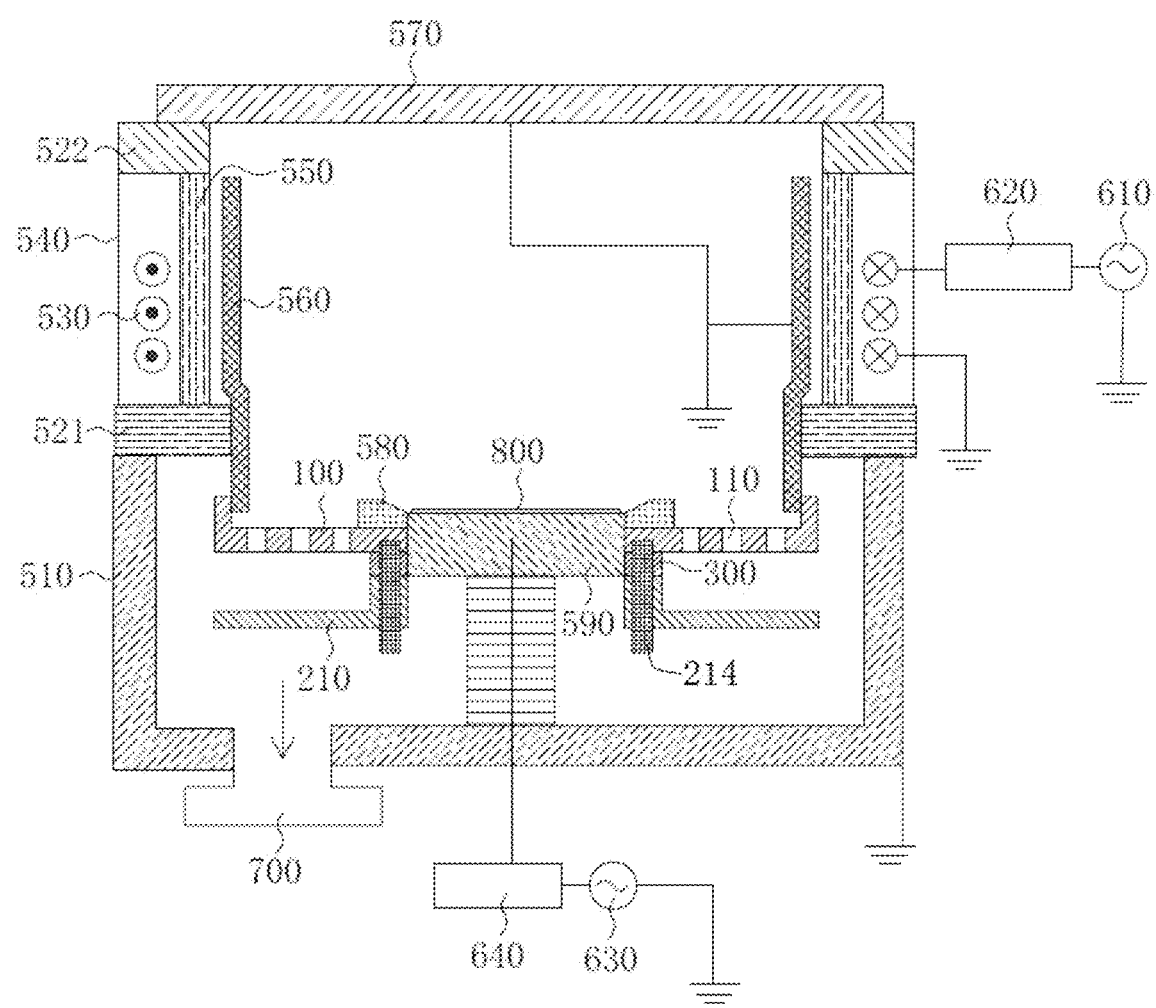
FIG. 1 illustrates a schematic structural diagram of a semiconductor pre-cleaning chamber according to some embodiments of the present disclosure.

Embodiments of the present disclosure provide a semiconductor pre-cleaning chamber. As shown in FIG. 1, the semiconductor pre-cleaning chamber includes a chamber body 510 and a Faraday cup 560 arranged in the chamber body 510, a base 590 configured to carry a wafer 800, and a collection assembly. The collection assembly is mounted to sleeve the base 590. When the base 590 is at a processing position, a protection plate 100 of the collection assembly can cooperate with the Faraday cup 560 to divide space inside the chamber body 510 into an upper sub-chamber and a lower sub-chamber.

In embodiments of the present disclosure, the semiconductor pre-cleaning chamber further includes a first metal ring 521, a second metal ring 522, a coil 530, a coil shielding box 540, a coupling window 550, a cover plate 570, a quartz ring 580, and an upper electrode radio frequency (RF) power supply 610, and an upper electrode matching device 620, a lower electrode RF power supply 630, a lower electrode matching device 640, and a vacuum pump 700. It should be noted that the above structure and corresponding working principle except for the collection assembly are mature existing technology, which is not improved in the present disclosure and are not repeated here.

In the semiconductor pre-cleaning chamber of the present disclosure, when the process is performed, the wafer 800 can be arranged on the base 590. The upper electrode RF power supply 610 can apply RF power to the coil 530 through the upper electrode matching device 620. The RF power can be coupled into the upper sub-chamber through the Faraday cup 560 to excite the process gas (e.g., argon) into a plasma. The RF power of the lower electrode RF power supply 630 can be applied to the base 590 through the lower electrode matching device 640 to cause the base 590 to generate an RF self-bias to attract the plasma to physically bombard the wafer 800 or a chemical reaction can be performed simultaneously to remove the impurities on the surface of the wafer. The particle impurities generated by the process can enter the lower sub-chamber through a first through-hole 110 of the protection plate 100. During this process, a large amount of particle impurities can be captured and collected by the collection plate 210, while the remaining particle impurities that are not captured by the collection plate 210 can be sucked and collected by the vacuum pump 700.

The collection assembly of embodiments of the present disclosure is described in detail below.

The collection assembly of embodiments of the present disclosure can be configured to collect the particle impurities in the semiconductor pre-cleaning chamber. As shown in FIG. 1, the collection assembly includes a protection plate 100 arranged at an interval in the semiconductor pre-cleaning chamber and a collection plate 210. The protection plate 100 can be annular. In some embodiments, a center through-hole 120 can be arranged at the protection plate 100. The protection plate can be sleeved on the base 590 through the center through-hole 120. A plurality of first through-holes 110 can be arranged at the protection plate 100 and configured to allow the process gas in the semiconductor pre-cleaning chamber to pass through. That is, the process gas can pass through the first through-holes 110 from the upper sub-chamber to enter the lower sub-chamber.

Figure 11:
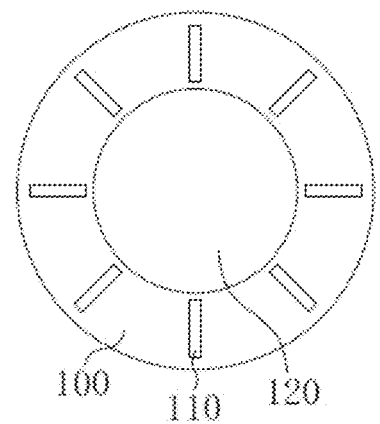
FIG. 11 illustrates a schematic cross-sectional diagram showing a protection plate of the collection assembly of the second form according to some embodiments of the present disclosure.
Figure 12:
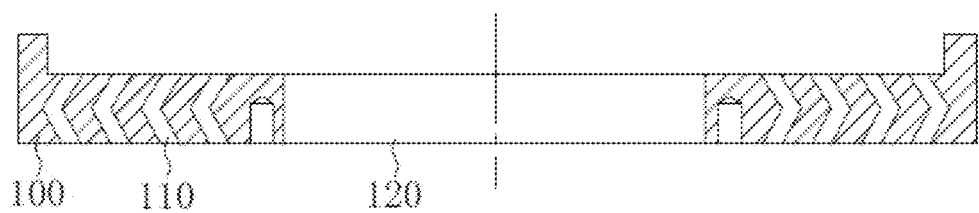
FIG. 12 illustrates a schematic cross-sectional diagram showing a protection plate of the collection assembly of the third form according to some embodiments of the present disclosure.
Figure 13:
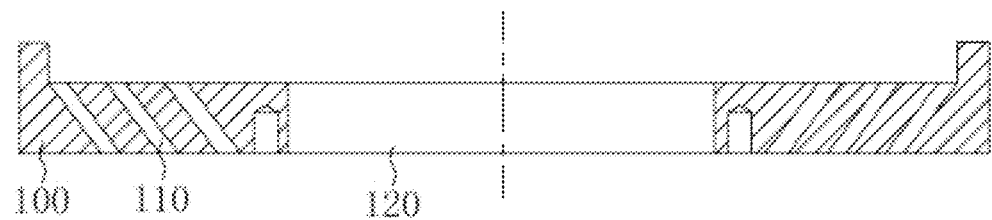
FIG. 13 illustrates a schematic cross-sectional diagram showing a protection plate of the collection assembly of the fourth form according to some embodiments of the present disclosure.

In embodiments of the present disclosure, as shown in FIG. 1, the first through-holes 110 are straight through-holes with a circular cross-sectional shape. However, in other embodiments of the present disclosure, the first through-holes 110 can also be in other forms. As shown in FIG. 11, the cross-sectional shape of the first through-holes 110 can also be rectangular. As shown in FIG. 12, the first through-holes 110 are also folded holes. As shown in FIG. 13, the first through-holes 110 are also oblique holes.

It should be noted that, regardless of the shape of the first through-holes 110, a diameter setting of the first through-holes 110 of the protection plate 100 meets the requirement that the plasma cannot pass through. Thus, the plasma can be effectively prevented from entering the lower sub-chamber below the protection plate 100 and causing the sub-chamber to spark.

Figure 10:
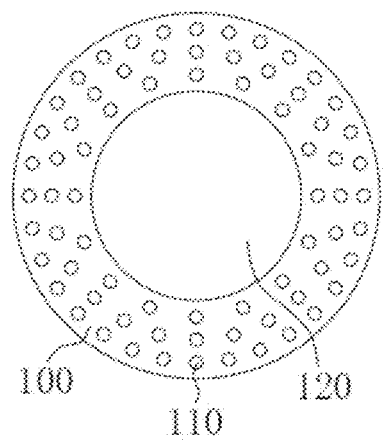
FIG. 10 illustrates a schematic cross-sectional diagram showing a protection plate of a collection assembly of a first form according to some embodiments of the present disclosure.

In embodiments of the present disclosure, as shown in FIG. 10, the plurality of first through-holes 110 are arranged in three circles around the center through-hole 120 of the protection plate 100. The first through-holes 110 of each circle can be evenly distributed along a circumference of the protection plate 100. Such an arrangement can ensure that the airflow and particle impurities in the upper sub-chamber can flow into the first through-holes 110 in a stable and sequential manner. Of course, in other embodiments of the present disclosure, no limitation can be imposed on a number of the circles of the first through-holes 110, a number of the first through-holes 110 of each circle, and whether the first through-holes 110 are evenly distributed.

The collection plate 210 can be arranged on a side of a gas outlet end of the first through-holes 110, that is, opposite to a gas outlet direction of the first through-holes 110, and can be configured to capture the particle impurities in at least a part of the semiconductor pre-cleaning chamber passing through the first through-holes 110. Since the collection plate 210 is opposite to the air outlet direction of the first through-holes 110, the airflow carrying a large amount of particle impurities can collide with the surface of the collection plate 210. Thus, the particle impurities can be effectively collected on the surface of the collection plate 210. Thus, the remaining particle impurities in the pre-cleaning chamber can be greatly reduced and even without residue. Therefore, the inner wall of the semiconductor pre-cleaning chamber can be difficult to be contaminated to reduce the risk of contaminating the wafer the second time. In addition, when the collection assembly of the present disclosure needs to be cleaned, the collection assembly can be dissembled for cleaning, which has strong maintainability.

In some optional embodiments, the collection plate 210 can be arranged in parallel to the protection plate 100. Of course, in practical applications, the collection plate 210 and the protection plate 100 can also form an included angle.

In some optional embodiments, the collection plate 210 can be annular and arranged oppositely to the protection plate 100. Orthographic projections of all the first through-holes 110 of the protection plate 100 on a horizontal plane can be within an orthographic projection of the collection plate 210 on the horizontal plane. Thus, the gas flowing out from all the first through-holes 110 can be ensured to collide with the surface of the collection plate 210 to further improve the collection effect of the particle impurities.

Figure 2:
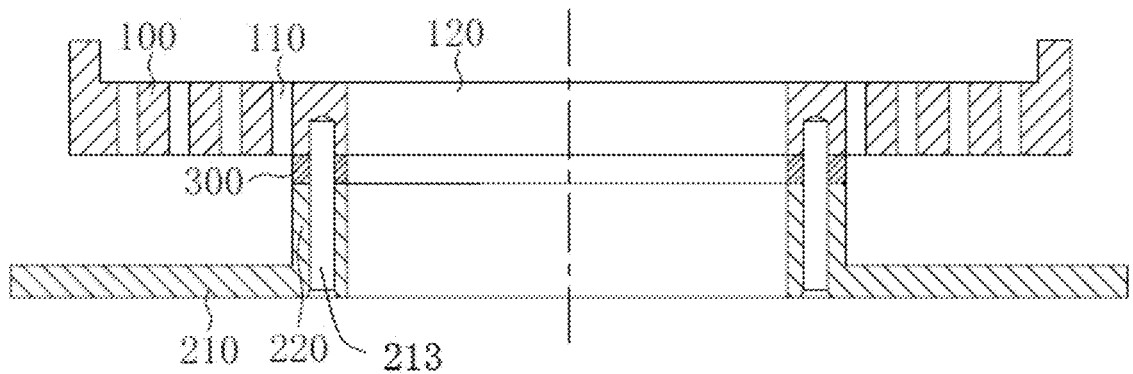
FIG. 2 illustrates a schematic structural diagram of a collection assembly of a second form according to some embodiments of the present disclosure.
Figure 3:
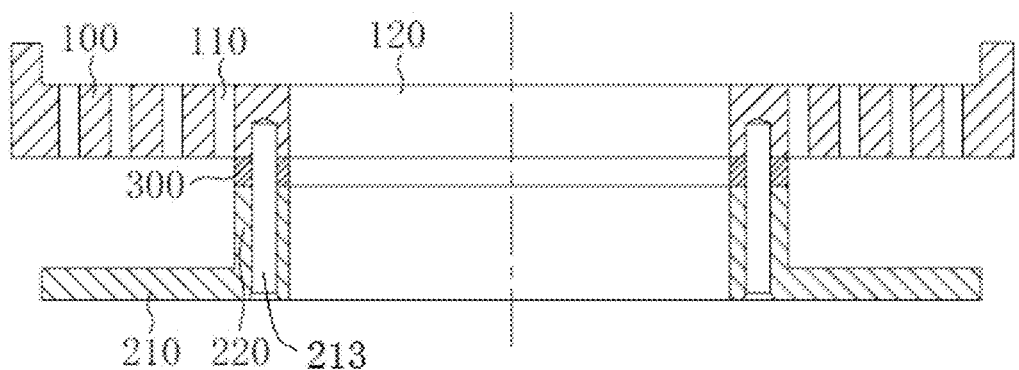
FIG. 3 illustrates a schematic structural diagram of a collection assembly of a third form according to some embodiments of the present disclosure.

In embodiments of the present disclosure, as shown in FIG. 1, the collection plate 210 and the protection plate 100 have a same outer diameter. That is, contours of two orthogonal projections of the collection plate 210 and the protection plate 100 on the horizontal plane coincide. However, in some other embodiments of the present disclosure, the contours of the orthogonal projections of the collection plate 210 and the protection plate 100 on the horizontal plane may not coincide. For example, as shown in FIG. 2, an outer diameter of the collection plate 210 is greater than an outer diameter of the protection plate 100. That is, the contour of the orthogonal projection of the collection plate 210 on the horizontal plane is outside the contour of the orthogonal projection of the protection plate 100. For another example, as shown in FIG. 3, the outer diameter of the collection plate 210 is smaller than the outer diameter of the protection plate 100. That is, the contour of the orthogonal projection of the collection plate 210 on the horizontal plane is inside the contour of the orthogonal projection of the protection plate 100. Regardless of the orthographic projections of the protection plate 100 and the collection plate 210 on the horizontal plane, as long as the orthogonal projections of all the first through-holes 110 of the protection plate 100 on the horizontal plane are within the orthogonal projection of the collection plate 210 on the horizontal plane to ensure the gas flowing out of all the first through-holes 110 to be able to collide with the surface of the collection plate 210.

In embodiments of the present disclosure, as shown in FIG. 1, a surface of the collection plate 210 opposite to the protection plate 100 is a plane. The plane is parallel to the protection plate 100. With such an arrangement, the particle impurities discharged by the first through-holes 110 can collide reliably with the surface of the collection plate 210 to facilitate the collection of the particle impurities. Of course, in practical applications, the plane can also be inclined relative to the protection plate 100.

Figure 7:
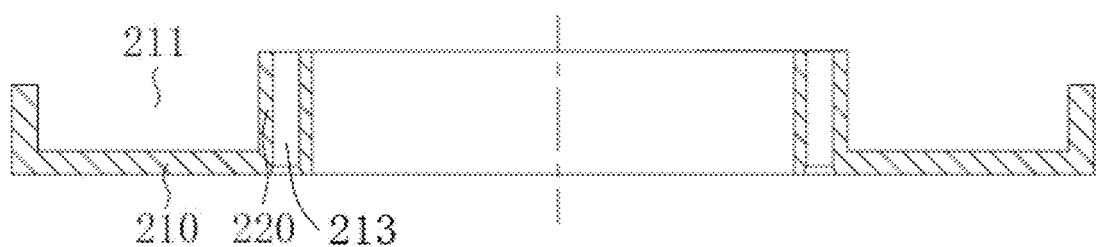
FIG. 7 illustrates a schematic cross-sectional diagram showing a collection plate of the collection assembly of the second form according to some embodiments of the present disclosure.

However, in some other embodiments of the present disclosure, the surface of the collection plate 210 opposite to the protection plate 100 may not be limited to a plane and may also have a concave structure. The concave structure can be beneficial for the particle impurities to rebound and collide between the surfaces of the protection plate 100 and the collection plate 210 opposite to each other to improve a collection rate of the particle impurities. In some embodiments, as shown in FIG. 7, the concave structure includes an annular groove 211 arranged around the circumference of the collection plate 210. A longitudinal cross-sectional shape of the annular groove 211 can include a rectangle, an arc, or a triangle. For example, the annular groove 211 shown in FIG. 7 has a rectangular longitudinal cross-sectional shape. The annular groove 211 shown in FIG. 8 has an arc-shaped longitudinal cross-section shape. The annular groove 211 shown in FIG. 9 has a triangular longitudinal cross-sectional shape. In addition, the longitudinal cross-sectional shape of the annular groove 211 can further be a stepped shape (not shown).

Figure 8:
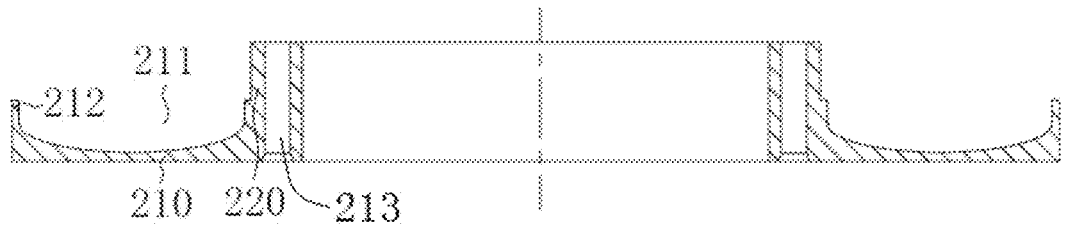
FIG. 8 illustrates a schematic cross-sectional diagram showing a collection plate of the collection assembly of the third form according to some embodiments of the present disclosure.
Figure 9:
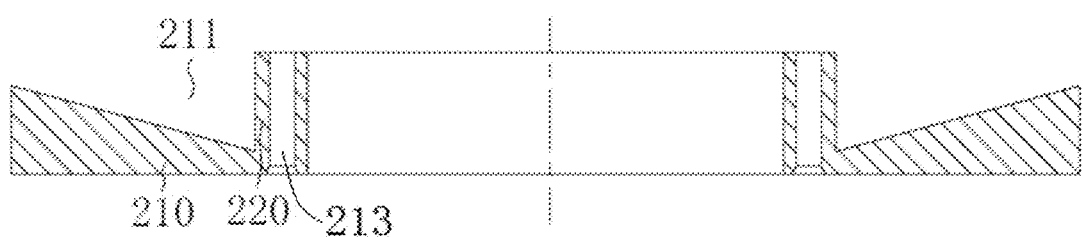
FIG. 9 illustrates a schematic cross-sectional diagram showing a collection plate of the collection assembly of the fourth form according to some embodiments of the present disclosure.

In some optional embodiments, as shown in FIG. 8, an annular protrusion 212 extending toward a direction close to the protection plate 100 is arranged at an outer peripheral edge of the collection plate 210. A gap is provided between an end of the annular protrusion 212 close to the protection plate 100 and the protection plate 100. With such an arrangement, it is beneficial for the particle impurities to bounce between the collection plate 210 and the protection plate 100 to further facilitate capturing and collecting the particle impurities to improve the collection rate.

In some optional embodiments, the collection assembly can further include a distance adjustment structure configured to adjust the distance between the collection plate 210 and the protection plate 100. By adjusting the distance between the collection plate 210 and the protection plate 100, a flowing guidance between the collection plate 210 and the protection plate 100 can be adjusted, that is, the ability to allow the gas to pass between the collection plate 210 and the protection plate 100. Thus, an air inlet volume and an air inlet speed of the semiconductor pre-cleaning chamber can be adjusted. In some embodiments, when the distance between the collection plate 210 and the protection plate 100 is smaller, the air inlet speed can be smaller, and the collection rate can be higher. On the contrary, when the distance between the collection plate 210 and the protection plate 100 is larger, the air inlet speed can be greater, and the collection rate can be lower. Based on this, when a relatively high requirement is imposed on the residue of the particle impurities of the surface of the wafer 800, the distance between the collection plate 210 and the protection plate 100 can be appropriately reduced to slow the air inlet speed to increase the collection rate. When a relatively low requirement is imposed on the residue of the particle impurities of the surface of the wafer 800, or a certain requirement is imposed on the air inlet speed, the distance between the collection plate 210 and the protection plate 100 can be appropriately increased to increase the air inlet speed.

In some optional embodiments, the distance between the collection plate 210 and the protection plate 100 can be greater than or equal to 3 mm and less than or equal to 20 mm.

In addition, adjusting the distance between the collection plate 210 and the protection plate 100 by the above distance adjustment structure can be applied to different processes. Thus, the semiconductor pre-cleaning chamber can be integrated with functions of various processing apparatuses to reduce the apparatus cost.

The above distance adjustment structure can have various structures. For example, as shown in FIGS. 1 to 4, the above distance adjustment structure includes at least a distance adjustment piece 300. The at least a distance adjustment piece 300 can be arranged between the collection plate 210 and the protection plate 100 and located at the inner peripheral edge or the outer peripheral edge of the protection plate 100. By setting a number and/or a thickness of the distance adjustment piece 300, the distance between the collection plate 210 and the protection plate 100 can be adjusted. The distance adjustment piece 300 can include, for example, a washer. In some embodiments, an inner diameter of the washer can be same as a diameter of the center through-hole 120.

Surfaces of the distance adjustment member 300 and the surfaces of the collection plate 210 opposite to the protection plate 100 can be roughened surfaces. For example, the surface of the collection plate 210 opposite to the protection plate 100 can be a surface treated by sandblasting or melting spray. With such an arrangement, the surface of the collection plate 210 can be beneficial to capture and store the particle impurities to further improve the collection effect.

In embodiments of the present disclosure, as shown in FIG. 1, one collection plate 210 is provided.

Figure 5:
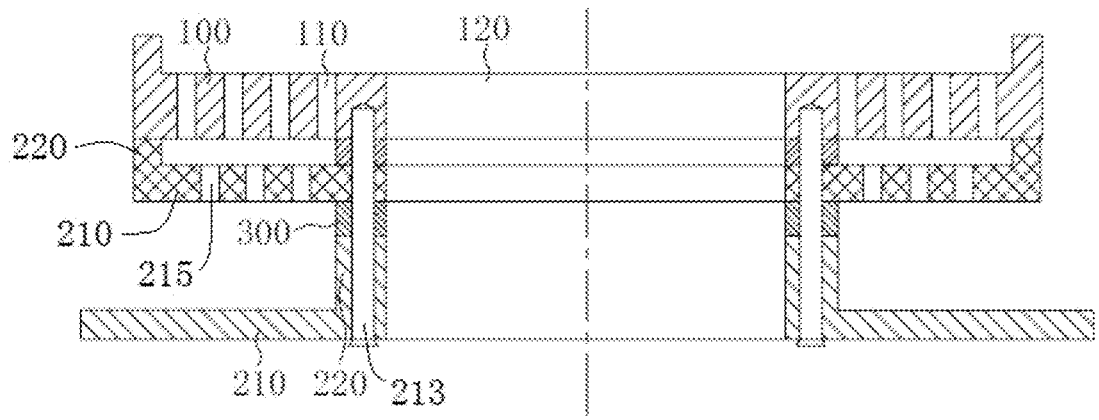
FIG. 5 illustrates a schematic structural diagram of a collection assembly of a fifth form according to some embodiments of the present disclosure.
Figure 6:
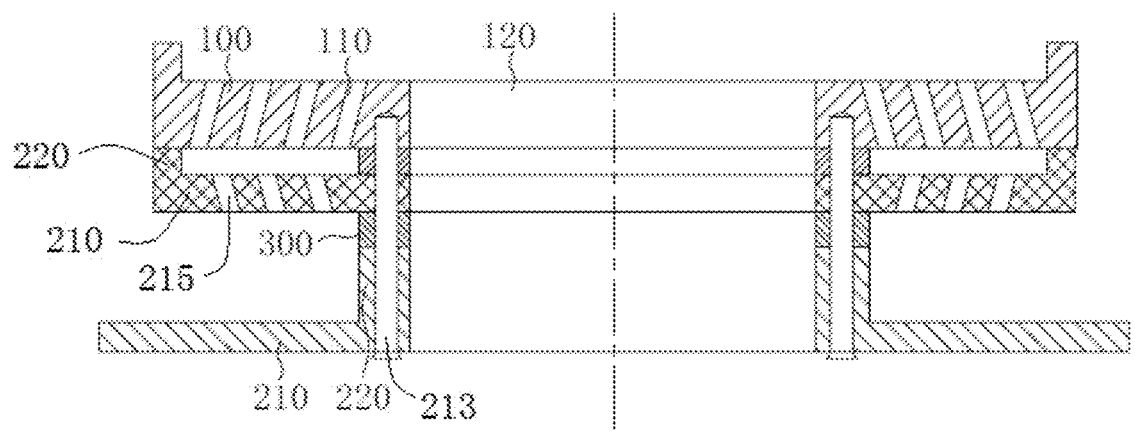
FIG. 6 illustrates a schematic structural diagram of a collection assembly of a sixth form according to some embodiments of the present disclosure.

However, in some other embodiments of the present disclosure, as shown in FIG. 5 and FIG. 6, a number of collection plates 210 is not limited to one. At least two collection plates 210 are provided and arranged at intervals along a direction away from the protection plate 100. In the at least two collection plates 210, except for the collection plate 210 farthest from the protection plate 100, the other collection plates 210 can all be provided with a plurality of second through-holes 215. Axes of the second through-holes 215 of two adjacent collection plates 210 cannot coincide. Axes of the second through-holes 215 of the collection plate 210 closest to the protection plate 100 cannot coincide axes of the first through-holes 110 of the protection plate 100.

By arranging the plurality of collection plates 210, the particle impurities can be filtered and collected layer by layer to further improve the collection rate of the particle impurities. Simultaneously, by causing the axes of the second through-holes 215 of the collection plate 210 closest to the protection plate 100 to not coincide with axes of the first through-hole 110 of the protection plate 100, the particle impurities discharged from the first through-holes 110 can be effectively prevented from continuing to transfer directly from the second through-holes 215 of the collection plate 210 closest to the protection plate 100, which can increase the probability of the collision between the particle impurities and the surface of the collection plate 210 and is beneficial to increase the collection rate of the particle impurities. By causing the axes of the second through-holes 215 of the two adjacent collection plates 210 to not coincide, the particle impurities discharged from the collection plate 210 can be effectively prevented from continuing to transfer directly from the second through-holes 215 of the next adjacent collection plate 210. Thus, the possibility of the particle impurities colliding with the surface of the next collection plate 210 can be increased to be beneficial for the next collection plate 210 to capture the particle impurities. Therefore, the utilization rate of the next collection plate 210 can be increased. The increment of the utilization reate of the collection plates 210 can be beneficial to increase the collection rate by using all the collection plates as a whole for the particle impurities.

In some other embodiments of the present disclosure, as shown in FIG. 5 and FIG. 6, when at least two collection plates 210 are provided. The distance adjustment piece 300 is also arranged between the two adjacent collection plates 210 to adjust the distance between the two adjacent collection plates 210.

In some optional embodiments, as shown in FIG. 2 and FIG. 3, a connection member 220 is further arranged at the collection plate 210. The connection member 220 can be arranged at the inner peripheral edge of the collection plate 210. In some embodiments, as shown in FIG. 2 and FIG. 3, the connection member 220 is a ring body. An outer diameter of the ring body can be smaller than the outer diameters of the collection plate 210 and the protection plate 100. An inner diameter of the ring body can be the same as the diameter of the central through-hole 120. The ring body can be arranged coaxially with the central through-hole 120. Thus, a gap can be provided between a part of the collection plate 210 outside the connection member 220 and the protection plate 100 and configured to allow airflow to flow out during the processes.

Moreover, a plurality of threaded holes 213 can be correspondingly arranged at the connection member 220, the distance adjustment member 300, and the protection plate 100, and can be distributed at intervals along the circumference of the protection plate 100. As shown in FIG. 1, the collection assembly further includes a plurality of fastening screws 214. The fastening screws 214 can be threadedly connected to the threaded holes 213 in a one-to-one correspondence and can be configured to fixedly connect the connection member 220, the distance adjustment member 300, and the protection plate 100.

Figure 4:
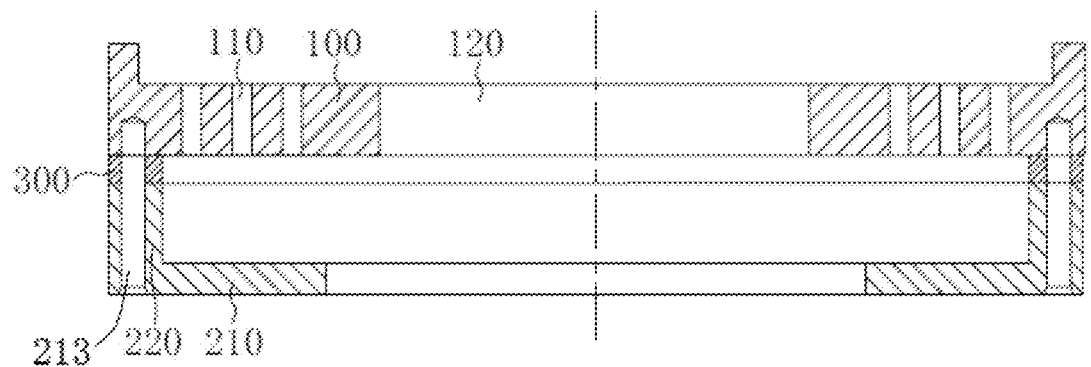
FIG. 4 illustrates a schematic structural diagram of a collection assembly of a fourth form according to some embodiments of the present disclosure.

In some other optional embodiments, as shown in FIG. 4, the connection member 220 is further arranged at the outer periphery of the collection plate 210. In some embodiments, the connection member 220 can be a ring body. An outer diameter of the ring body can be equal to the outer diameter of the protection plate 100. An inner diameter of the ring body can be larger than the diameter of the center through-hole 120. The ring body and the center through-hole 120 can be arranged coaxially. Thus, a gap can be arranged between the part of the collection plate 210 on an inner side of the connection member 220 and the protection plate 100 and be configured for the airflow to flow out during the processes. Then, the airflow can flow out through the center through-hole of the collection plate 210.

In some other embodiments of the present disclosure, as shown in FIG. 5 and FIG. 6, when the number of collection plates 210 is at least two, each collection plate 210 is provided with a connection member 220. A collection plate 210 closest to the protection plate 100 can be a first collection plate. The other collection plates 210 can be second collection plates. A connection member 220 of the first collection plate can be arranged between the first collection plate and the protection plate 100. A connection member 220 of a second collection plate can be arranged between two neighboring second collection plates.

In some embodiments, the connection members 220 on the at least two collection plates 210 can be arranged at the inner or outer peripheral edges of the collection plates 210, or connection members 220 of some collection plates 210 can also be arranged t the inner peripheral edges of the collection plates 210, and connection members 220 of some other collection plates 210 can be arranged at the outer peripheral edge of the collection plates 210. For example, as shown in FIG. 5 and FIG. 6, the connection member 220 of the first collection plate of the collection plates 210 closest to the protection plate 100 is arranged at the outer peripheral edge of the collection plate 210 and can block the airflow from passing through between the protection plate 100 and the first collection plate. Thus, the airflow can flow out through the second through-holes 215. The connection member 220 of the second collection plate can be arranged at the inner peripheral edge of the collection plate 210. Moreover, the threaded holes may also not be arranged at the connection member 220 of the first collection plate. The threaded holes can be arranged at a position of the first collection plate corresponding to the threaded holes 213 of the connection member 220 of the second collection plate.

Thus, the first collection plate and the second collection plate can be fixedly connected through the fastening screws 314.

Finally, it should be noted that in the specification, relational terms such as "first" and "second" are only used to distinguish one entity or operation from another entity or operation, and do not necessarily require or imply any such actual relationship or order between such entities or operations. Furthermore, the term "comprising," "including," or any other variation thereof is intended to cover a non-exclusive inclusion. Thus, a process, method, article, or apparatus comprising a set of elements that includes a series of elements includes not only those elements, but also includes elements not expressly listed, or elements inherent in such a process, method, article, or apparatus.

With the above description of the disclosed embodiments, those skilled in the art can implement or use the present disclosure. Various modifications to the embodiments are apparent to those skilled in the art. The general principle defined in the specification may be implemented in other embodiments without departing from the spirit or scope of the present disclosure. Therefore, the present disclosure is not limited to the embodiments shown in the specification but conforms to the widest scope consistent with the principles and novel features disclosed in the specification.

What is claimed is:

1. A collection assembly configured to collect particle impurities in a semiconductor pre-cleaning chamber comprising:
   a protection plate being annular and including a plurality of first through-holes configured for a process gas to pass through in the semiconductor pre-cleaning chamber;
   at least two collection plates arranged at intervals along a direction away from the protection plate in the semiconductor pre-cleaning chamber, located on a side of a gas outlet end of the first through-holes, and configured to capture at least a part of the particle impurities in the semiconductor pre-cleaning chamber passing through the first through-holes, an outer peripheral edge of a collection plate of the at least two collection plates farthest away from the protection plate including an annular protrusion extending toward a direction close to the protection plate, an upper surface of the annular protrusion being lower than a lower surface of the protection plate, wherein:
   except for the collection plate farthest away from the protection plate, a plurality of second through-holes are arranged at each of at least one other collection plate,
   axes of the first through-holes of the protection plate gradually move away from a central axis of the protection plate from top to bottom, and
   axes of second through-holes of a collection plate of the at least two collection plates closest to the protection plate gradually move toward a central axis of the collection plate closest to the protection plate from top to bottom;
   a first connection member arranged at an inner peripheral edge of the collection plate farthest away from the protection plate and a plurality of threaded holes are correspondingly arranged at the first connection member, the at least one other collection plate than the collection plate farthest away from the protection plate, and the protection plate, the plurality of threaded holes are distributed at intervals along a circumference of the protection plate;
   at least one second connection member arranged at an outer peripheral edge of the at least one other collection plate than the collection plate farthest away from the protection plate, the at least one second connection member each comprising a ring body, an upper surface of a second connection member of the collection plate closest to the protection plate contacting the lower surface of the protection plate;
   a distance adjustment structure including at least one distance adjustment piece arranged between the collection plate closest to the protection plate and the protection plate and configured to adjust a distance between the collection plate closest to the protection plate and the protection plate, being inside a lower sub-chamber of the semiconductor pre-cleaning chamber by setting a number and/or thickness of the distance adjustment piece, including a plurality of through-holes in a one-to-one correspondence with the plurality of threaded holes of the first connection member; and
   a plurality of fastening screws threadedly connected through the plurality of threaded holes of the first connection member and the plurality of through-holes of the distance adjustment structure to fixedly connect the first connection member, the distance adjustment member, and the protection plate.

2. The collection assembly according to claim 1, wherein:
   the collection plate closest to the protection plate is annular and arranged opposite to the protection plate; and
   orthogonal projections of the first through-holes of the protection plate on a horizontal plane are within an orthogonal projection of the collection plate closest to the protection plate on the horizontal plane.

3. The collection assembly according to claim 2, wherein:
   a surface of the collection plate closest to the protection plate opposite to the protection plate is a plane; and
   the plane is parallel to the protection plate or is inclined relative to the protection plate.

4. The collection assembly according to claim 2, wherein a surface of the collection plate closest to the protection plate opposite to the protection plate has a concave structure.

5. The collection assembly according to claim 4, wherein the concave structure includes an annular concave groove arranged around a circumference of the collection plate closest to the protection plate.

6. The collection assembly according to claim 5, wherein a shape of a longitudinal cross section of the annular groove includes a rectangle.

7. The collection assembly according to claim 1, wherein a gap is provided between an end of the annular protrusion close to the protection plate and the protection plate.

8. The collection assembly according to claim 1, wherein a surface of the collection plate closest to the protection plate opposite to the protection plate is a roughened surface.

9. The collection assembly according to claim 1, wherein:
   the at least one distance adjustment piece is located at an inner peripheral edge of the protection plate.

10. The collection assembly according to claim 1, wherein:
    axes of the plurality of second through-holes of two neighboring collection plates do not coincide; and
    the axes of the second through-holes of the collection plate closest to the protection plate do not coincide with the axes of the first through-holes of the protection plate.

11. The collection assembly according to claim 1, wherein the collection plate closest to the protection plate is a first collection plate, and the distance adjustment structure is a first distance adjustment structure;
the collection assembly further comprising:
   a second collection plate of the at least two collection plates arranged farther away from the protection plate than the first collection plate; and
   a second distance adjustment structure arranged between the first collection plate and the second collection plate and configured to adjust a distance between the first collection plate and the second collection plate.

* * * * *